US009124963B2

(12) United States Patent  (10) Patent No.: US 9,124,963 B2
Martin et al.  (45) Date of Patent: Sep. 1, 2015

(54) HEARING APPARATUS HAVING AN ADAPTIVE FILTER AND METHOD FOR FILTERING AN AUDIO SIGNAL

(71) Applicant: SIEMENS MEDICAL INSTRUMENTS PTE. LTD., Singapore (SG)

(72) Inventors: Rainer Martin, Bochum (DE); Thomas Pilgrim, Erlangen (DE); Henning Puder, Erlangen (DE); Alexander Schasse, Bochum (DE); Wolfgang Soergel, Erlangen (DE)

(73) Assignee: Sivantos Pte. Ltd., Singapore (SG)

( * ) Notice: Subject to any disclaimer, the term of this patent is extended or adjusted under 35 U.S.C. 154(b) by 311 days.

(21) Appl. No.: 13/770,055

(22) Filed: Feb. 19, 2013

(65) Prior Publication Data

US 2013/0216062 A1   Aug. 22, 2013

(30) Foreign Application Priority Data

Feb. 17, 2012 (DE) .......................... 10 2012 202 469

(51) Int. Cl.
*H04R 5/00* (2006.01)
*H04R 25/00* (2006.01)
*H04R 3/00* (2006.01)
*H03H 21/00* (2006.01)

(52) U.S. Cl.
CPC ................ *H04R 3/00* (2013.01); *H04R 25/505* (2013.01); *H03H 2021/0041* (2013.01); *H03H 2021/0094* (2013.01); *H03H 2240/00* (2013.01); *H04R 2225/43* (2013.01); *H04R 2430/03* (2013.01); *H04R 2460/03* (2013.01)

(58) Field of Classification Search
None
See application file for complete search history.

(56) References Cited

U.S. PATENT DOCUMENTS 7,181,034 B2    2/2007  Armstrong
2012/0008791 A1 1/2012  Gerkmann et al.

FOREIGN PATENT DOCUMENTS

DE         69815836 T2     1/2004
DE       102010026884 A1   1/2012
EP           1251715 A2    10/2002

OTHER PUBLICATIONS

Heinrich W. Löllmann et al., "Low Delay Filter-Banks for Speech and Audio Processing", Institute of Communication Systems and Data Processing, RWTH Aachen, Germany; Others.

*Primary Examiner* — Regina N Holder
(74) *Attorney, Agent, or Firm* — Laurence A. Greenberg; Werner H. Stemer; Ralph E. Locher

(57) ABSTRACT

A hearing apparatus that processes an audio signal by adaptive filtering operates efficiently. The hearing apparatus has a first stage transformation unit and at least two second stage transformation units. Each of the second stage transformation units splits the signal of one of the first stage channels through transformation onto sub-channels of the channel. A filter unit in each channel that has a second stage transformation unit filters the signal of the channel depending on weighting factors that are determined in each case for the sub-channels. The filter units are configured to exchange weighting factors among themselves, which means that only some of the weighting factors actually need to be calculated.

19 Claims, 11 Drawing Sheets

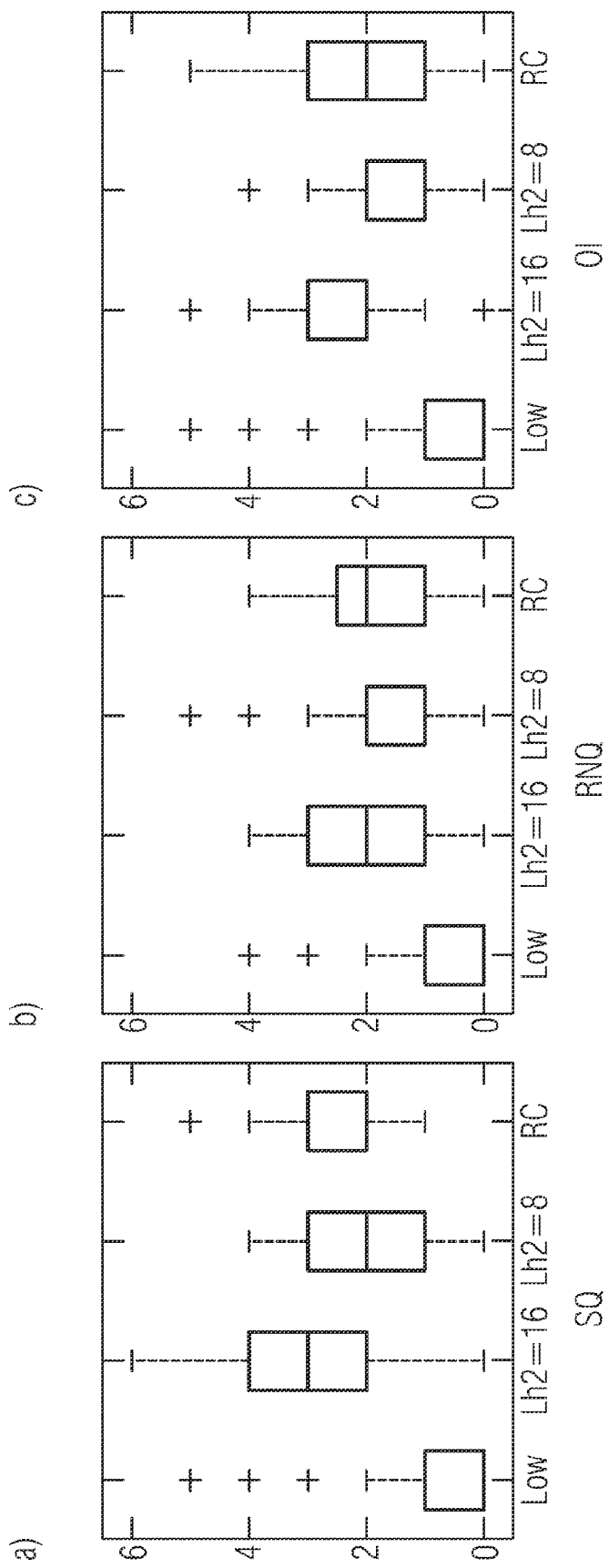

HEARING APPARATUS HAVING AN ADAPTIVE FILTER AND METHOD FOR FILTERING AN AUDIO SIGNAL

CROSS-REFERENCE TO RELATED APPLICATION

This application claims the priority, under 35 U.S.C. §119, of German patent application DE 10 2012 202 469.7, filed Feb. 17, 2012; the prior application is herewith incorporated by reference in its entirety.

BACKGROUND OF THE INVENTION

Field of the Invention

The invention relates to a hearing apparatus and a method through which an audio signal is transformed by means of a first stage transformation unit into a plurality of sub-band signals and at least some of these sub-band signals are transformed by means of a second stage transformation unit into sub-sub-band signals. A hearing apparatus and a method of this type are known from commonly assigned Patent Application Publication US 2012/0008791 A1 and its counterpart German patent application DE 10 2010 026 884. A hearing apparatus is understood here to be any device producing sound, which can be worn in or on the ear, in particular a hearing aid, a headset and headphones. Furthermore, the hearing apparatus in question according to the invention can in particular also be a mobile telephone.

Hearing aids are wearable hearing apparatuses which are used for providing care for the hard of hearing. In order to meet the numerous individual needs, different designs of hearing aids such as behind-the-ear hearing aids (BTE), hearing aid with an external earpiece (RIC: receiver in the canal) and in-the-ear hearing aids (ITE), for example also concha hearing aids or completely-in-canal hearing aids (ITE, CIC), are made available, The hearing aids cited by way of example are worn on the outer ear or in the auditory canal In addition, bone conduction hearing aids, implantable or vibrotactile hearing aids are however also available on the market. In this situation the stimulation of the damaged hearing takes place either mechanically or electrically.

In principle, hearing aids have as their essential components an input converter, an amplifier and an output converter. The input converter is as a rule a sound receiver, for example a microphone, and/or an electromagnetic receiver, for example an induction coil. The output converter is implemented for the most part as an electroacoustic converter, for example a miniature loudspeaker, or as an electromechanical converter, for example a bone conductor. The amplifier is usually integrated in a signal processing unit. This basic structure is illustrated in FIG. 1 by way of example of a behind-the-ear hearing aid. One or more microphones 2 for receiving the sound from the surroundings are incorporated into a hearing aid case 1 for wearing behind the ear. A signal processing unit (SPU) 3, which is likewise integrated in the hearing aid case 1, processes the microphone signals and amplifies them. The output signal from the signal processing unit 3 is transferred to a loudspeaker or earpiece 4 which outputs an acoustic signal. Where applicable, the sound is transferred by way of a sound tube, which is fixed in the auditory canal by means of an earmold, to the eardrum of the device wearer. The power supply for the hearing aid and in particular for the signal processing unit 3 is provided by a battery (BAT) 5 likewise integrated in the hearing aid case 1.

With regard to the signal processing unit 3, its requirement for electrical power is dependent on how many arithmetic operations it must perform within a certain time. In order not to reduce the life of the battery 5 unnecessarily, every effort is therefore made to organize the processing of audio signals, in other words of a signal from the input converter or of a telecommunication signal, as efficiently as possible so as to avoid unnecessary arithmetic operations.

In the above-mentioned patent application publication, there is described a method by means of which on the basis of a two-stage spectral transformation the audio signal is firstly split up into sub-band signals and subsequently in the second stage if required some of the sub-band signals are in turn transformed into sub-sub-band signals. In this situation, the sub-band signals can be processed in the manner known for hearing aids in order by this means for example to amplify the levels of the individual sub-band signals in accordance with the hearing ability of the user of the hearing apparatus. As a result of splitting up a sub-band signal into the sub-sub-band signals, this typical structure of a hearing apparatus is expanded such that the sub-sub-band signals are sufficiently narrow-band in order for example to enable background noise in several of the sub-sub-band signals to be specifically suppressed in a speech signal without significantly affecting a speech signal contained at the same time in the remaining sub-sub-band signals. In this situation, this background noise production is based on the principle of calculating for each of the sub-sub-band signals, in other words the signals from the second transformation stage, an attenuation factor, the value of which depends on whether primary undesired noise or a desired signal, speech for instance, is contained in the sub-sub-band signal. In this situation, the calculation of the weighting factor is carried out depending on the waveform of the sub-sub-band signal, in other words the individual attenuation factors are adaptive.

If a very large number of the sub-band signals are now split up by means of the second transformation stage into sub-sub-band signals and if an attenuation factor is calculated for each of these sub-sub-band signals, then this can result in the fact that the processing of an audio signal requires a great many calculation steps per given unit of time. Depending on the signal processing unit used and the capacity of the battery used, it may therefore happen in certain cases that the signal processing is either overtaxed or the battery needs to be changed very frequently.

SUMMARY OF THE INVENTION

It is accordingly an object of the invention to provide a hearing device with an adaptive filter and a method for filtering an audio signal which overcome the above-mentioned disadvantages of the heretofore-known devices and methods of this general type and which enables a hearing apparatus which processes an audio signal by means of an adaptive filter to operate efficiently.

With the foregoing and other objects in view there is provided, in accordance with the invention, a method for the adaptive filtering of an audio signal, the method which comprises:

transforming the audio signal by a first transformation stage and thereby generating a sub-band signal in each of a plurality of channels; and in at least some of the plurality of channels, adaptively filtering the respective sub-band signal by a filter unit of the channel, and thereby in the channel:

transforming the sub-band signal by a second transformation stage and splitting onto a plurality of sub-channels of the channel; and in each sub-channel, defining a weighting factor for the signal of the sub-channel by the filter unit of the channel;

wherein, with regard to at least one of the filter units, the weighting factor of at least one sub-channel is defined by calculation depending on the signal of the sub-channel itself and the calculated weighting factor is transferred by the filter unit to at least one other filter unit, and with regard to the at least one other filter unit, the weighting factor of at least one sub-channel is defined on the basis of the received, calculated weighting factor.

The method according to the invention is used for the adaptive filtering of audio signals, in other words for filtering depending on the waveform of the audio signal itself. By this means it is for example possible to suppress a noise component in the audio signal while at the same time a desired signal component is retained. Likewise, an adaptive filtering means that it is possible to achieve an emphasis of individual signal components, for example of consonants in a speech signal. The method is based here on a multi-stage filter bank arrangement, in other words the audio signal is transformed by a first transformation stage, whereby a sub-band signal is generated in each of a plurality of channels. A sub-band signal is understood here to be a signal of the channel which represents the information contained in a predetermined spectral band (channel) of the audio signal. With regard to the first transformation stage, this can for example be a filter bank, as is typically used in a hearing aid so as for example to split up an audio signal into thirty-two or more sub-band signals, in order then to raise the levels of individual sub-band signals in accordance with the hearing ability of a user of the hearing aid.

In at least some of these channels the respective sub-band signal is adaptively filtered by a filter unit of the channel. Not all the channels need be affected. For adaptive filtering, in order to differentiate between desired signal and noise signal a frequency resolution is required which is greater than that achieved by the first transformation stage. To this end, in each of the channels in which the sub-band signal is filtered by a filter unit their sub-band signal is firstly transformed by a second transformation stage and split up onto a plurality of sub-channels of the respective channel. In each sub-channel a weighting factor for the signal of this sub-channel is then defined by the filter unit of the channel. This weighting factor serves to define in each case whether the signal of this sub-channel on the one hand is to be amplified or its level at least maintained or whether the signal is instead to be attenuated because it for example essentially represents an interference signal, for instance a noise. If an audio signal is now firstly divided into channels and a plurality of these channels is subsequently divided again into sub-channels, then this means that a correspondingly large number of weighting factors, namely one per sub-channel, is to be defined for adaptive filtering of the audio signal. With regard to the filter bank described above having thirty-two channels and a subsequent splitting of each of these channels into for example sixteen sub-channels, this can mean that five hundred and twelve weighting factors need to be determined. A signal processing unit as is typically provided in a hearing aid or a mobile telephone may very well reach the limit of its computing power, depending on the filter algorithm used in this case. The method according to the invention does however now make it possible to perform the adaptive filtering particularly efficiently, such that the number of calculation steps required in order to determine the weighting factors can be reduced by fifty percent and more. To this end, with regard to at least one of the filter units (in other words therefore in at least one channel), although the weighting factor of at least one sub-channel is defined by calculation depending on the signal of the sub-channel itself, as is simply necessary in order to determine an adaptive weighting factor, this calculated weighting factor is then however not only used by this filter unit for filtering of the sub-channel itself but is additionally also transferred to at least one other filter unit. With regard to the at least one other filter unit, in at least one its sub-channels the weighting factor is then not defined through calculation of a separate weighting factor on the basis of the signal of the separate sub-channel but on the basis of the received weighting factor already calculated by the other filter unit. One and the same weighting factor calculated by the first filter unit is therefore used in a plurality of sub-channels. In the following, in connection with the transfer of a calculated weighting factor the formulations "to a filter unit of a different channel" and "to a different channel" and "to a sub-channel of a different channel" are used synonymously. They ultimately describe the same operation.

Through the method according to the invention an adaptive filtering having an auditive quality can be achieved which performs just as well in hearing tests as an adaptive filtering wherein for each sub-channel the weighting factor is calculated individually and depending on the respective signal of the sub-channel itself. In this case the invention takes advantage of the knowledge that in the case of a multi-stage filter bank the original audio signal is represented in redundant fashion by the signals of the sub-channels. In other words, for a certain sub-channel for which a weighting factor is calculated depending on the signal of the sub-channel itself, at least one other sub-channel whose signal behaves very similarly can be found. If the calculation of the weighting factor therefore yields a very small value, for instance because it is recognized by the corresponding filter unit that the signal in the sub-channel is essentially an unwanted noise, then on account of the knowledge that the audio signal is represented in redundant fashion a further sub-channel can also be found where it can likewise be assumed that it essentially contains a noise. Accordingly, the weighting factor does not need to be re-calculated for this further sub-channel but the already calculated weighting factor can be taken over. It can thus for example happen in the case of a multi-stage filter bank that two sub-channels overlap spectrally. In other words, the two sub-channels at least partially represent the same spectral component of the audio signal. In such a case the weighting factor which has been calculated for one of the sub-channels can also be used for the other sub-channel without significant losses in audio quality. It is especially favorable for the audio quality in this case if the two sub-channels have the same center frequencies.

In order to ascertain to which sub-channels a calculated weighting factor can expediently be transferred, in accordance with an embodiment of the method according to the invention, in each case the cross-correlations between a signal of a sub-channel of a first channel on the one hand and the signals of the sub-channels of another channel on the other hand are calculated. The weighting factor calculated for the first sub-channel is then expediently transferred to those of the sub-channels of the other channel where a value for the cross-correlation is greater than a predetermined threshold value. In this situation the cross-correlation is expediently calculated on the basis of test signals or on the strength of a mathematical analysis already implemented during development of the hearing apparatus.

In a sub-channel in which the weighting factor is not to be calculated but is to be taken over from another sub-channel, the weighting factor can be formed from one or even a plurality of received, already calculated weighting factors. It is for example conceivable to scale the received weighting factors to the particular extent (by multiplying by a value from zero to one) in which the sub-channel is correlated with the corresponding sub-channels. The scaled weighting factors can then be combined with the sought weighting factor. It has however proved particularly efficient simply to take a single received weighting factor and to adopt this unchanged also as the weighting factor for the current sub-channel.

A further, particularly efficient implementation of the method according to the invention results if calculated weighting factors from a plurality of adjacent sub-channels of a first channel are transferred groupwise to another filter unit. This takes place preferably in accordance with a predetermined copy model, according to which the calculated weighting factors are transferred in a memory of the second filter unit, where they then form weighting factors of corresponding adjacent sub-channels of the second channel.

The calculation overhead for the adaptive filtering can be reduced particularly drastically if at least one of the calculated weighting factors is transferred to a plurality of other filter units. In the same manner it has proved expedient if also within at least one of the filter units a weighting factor is transferred to another sub-channel of the same filter unit. Also within a channel it is namely possible to utilize multiple instances of an already calculated weighting factor. Which sub-channels are suitable here can for example be recognized by calculating the cross-correlations between the sub-channels of the channel.

For the auditive quality of the filtered audio signal it has also proved particularly favorable to always transfer all weighting factors either only upwards or only downwards in frequency, in other words to filter units of those channels which have a higher (frequency upward) or a lower (frequency downward) center frequency than the particular channel in which the weighting factor of the sub-channel was calculated.

In which of the sub-channels the weighting factors are calculated depending on the respective signals of the sub-channels themselves and in which sub-channels on the other hand already calculated weighting factors are received and taken over for the filtering can be freely defined on the basis of the described criteria. It is therefore possible that in a certain filter unit the weighting factors in some of the sub-channels are defined by calculation and the weighting factors of other sub-channels are received from at least one other filter unit. As a further option, provision can also be made that a sub-channel is weighted with a predetermined constant value if the share of the signal of this sub-channel in the overall audio signal is for example insignificant. As already mentioned, a weighting factor can also be transferred between sub-channels within one and the same filter unit.

The actual filtering of the sub-band signal of a channel by means of the individual weighting factors for the sub-channels can take place in two different ways. In accordance with an embodiment of the method according to the invention, the signal of each sub-channel is weighted with the weighting factor defined for this sub-channel, therefore either multiplied directly or scaled in a comparable manner. Subsequently, the weighted signals of all sub-channels of the channel are then jointly back-transformed by means of a back-transformation stage and combined to form a filtered sub-band signal (first stage). With regard to the back-transformation, the operation in question is one which is inverted with respect to the transformation operation of the second transformation stage by means of which the sub-band signal was split up onto the sub-channels. Overall, this form of adaptive filtering yields the advantage that each sub-channel can be influenced specifically by a weighting factor intended for it and thus certain signal components are specifically suppressed (noise signal) in the audio signal or are transferred without distortion (desired signal).

A further option for filtering on the basis of the weighting factors results if not the signals themselves but the weighting factors of all sub-channels are jointly back-transformed by a back-transformation stage and combined to produce a filter function. This filter function is then used in order to generate a filtered sub-band signal by filtering the sub-band signal by means of the filter function. This embodiment of the method according to the invention has the advantage that through appropriate windowing of the filter function on the one hand the overhead for calculating the filtered sub-band signal can once more be significantly reduced and on the other hand a filtering having a very short time delay is also possible. Furthermore, this embodiment of the method is based on the knowledge that for example the method of Löllmann and Vary (H. W. Löllmann and P. Vary, "Low delay filter-banks for speech and audio processing", in Eberhard Hänsler and Gerhard Schmidt: Speech and Audio Processing in Adverse Environments, Springer Berlin Heidelberg, 2008) can be used not only for the time signal, as provided for by Löllmann and Vary, but also for a spectral signal or sub-band signal, as is present in the channels at the output of the first transformation stage. In particular, it should be noted here that the method can also be applied to the as a rule complex-valued sub-band signals of such a transformation stage.

With the above and other objects in view there is also provided, in addition to the method described herein, a hearing apparatus according to the invention. The latter incorporates all those components which are required in order to implement the method according to the invention. A first stage transformation unit is thus provided which is designed so as to split up a signal through transformation onto a plurality of channels. For at least two of these channels a second stage transformation unit is provided in each case which is designed so as to split the signal of the respective channel (referred to above as sub-band signal) through transformation onto sub-channels of the channel. With regard to the transformation units, in each case this can for example involve a spectral transformation, in particular a discrete Fourier transformation, or also a filter bank, such as a polyphase filter bank. A combination can also be used, for instance in the form of a filter bank on the basis of a discrete Fourier transformation.

In each channel which has a second stage transformation unit a filter unit is moreover provided, each of which is designed so as to filter the signal of the channel. As already described the filtering takes place in this situation on the basis of weighting factors which are determined for the individual sub-channels of the channel. In order to keep the calculation overhead for the adaptive filtering low here, the filter unit of a channel has in each of only some of the sub-channels a calculation unit which is designed so as to actually calculate the weighting factor of the sub-channel and to do this depending on the signal of the sub-channel. Such a calculation unit is referred to here as an estimation unit. In at least some of the other sub-channels the filter unit has no such estimation unit but only a receive unit which is designed so as to receive a calculated weighting factor from another filter unit and to define this as the weighting factor for its own sub-channel.

With regard to the estimation units, these preferably involve a statistical estimator for a desired signal component of the signal of the respective sub-channel, for instance therefore a Wiener filter. The weighting factors are then in each case so-called filter gains. Statistical estimators have proved to be very advantageous for the adaptive filtering of audio signals.

In order to enable a calculated weighting factor to be utilized as effectively as possible in a plurality of sub-channels, provision is expediently made that adjacent channels overlap spectrally in the case of the first stage transformation unit. In the context of the invention this should mean that the transfer functions of two adjacent channels each have a passband and that these passbands overlap. A passband is to be understood as that frequency range, the center frequency of which is defined by the main lobe maximum of the transfer function of the channel and the bandwidth of which is limited by the first null point to the right and left of the main lobe maximum. An advantage yielded by overlapping passbands is the fact that the overall transfer function of the first stage transformation unit has a particularly smooth spectral waveform and thus the audio signal is not excessively distorted by the transformation itself. A further advantage yielded at the same time however is also the redundant representation, which can be utilized in order to save on arithmetic operations in the manner described.

By preference in this situation the hearing apparatus is designed in such a manner that a sub-channel of a first channel and a sub-channel of another, second channel overlap spectrally in such a manner that they have the same center frequency. This yields the advantage that the transfer of the weighting factor of the sub-channel of the first channel onto the sub-channel of the second channel results in only a very small, as a rule imperceptible distortion if this type of filtering is compared with the common filtering in which the weighting factors are calculated explicitly in both channels.

Depending on the intended use, the hearing apparatus can also have a back-transformation unit which is designed so as to back-transform output signals from the filter units and by this means to generate a filtered audio signal which then for example can be emitted by way of an earpiece to an ear of the user of the hearing apparatus. In this situation, through the back-transformation a transformation of the filtered sub-band signals is in particular implemented which is inverted with respect to the transformation of the first stage.

The invention also covers further embodiments of the hearing apparatus according to the invention. These developments exhibit features as have already been described in conjunction with the method according to the invention. For this reason these other developments of the hearing apparatus according to the invention are not described again here. The invention likewise also covers developments of the method according to the invention which exhibit features as have already been described in conjunction with the hearing apparatus according to the invention. These developments of the method according to the invention are therefore also not described again here.

Finally, it should also be noted here that the analysis filter bank described can also have more than two transformation stages, where the method according to the invention accordingly also does not then necessarily need to be carried out on the basis of signals of two transformation stages immediately following one another.

Other features which are considered as characteristic for the invention are set forth in the appended claims.

Although the invention is illustrated and described herein as embodied in a hearing apparatus having an adaptive filter and a method for filtering an audio signal, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIG. 11 shows the result of a hearing test.

DETAILED DESCRIPTION OF THE INVENTION

Figure 1:
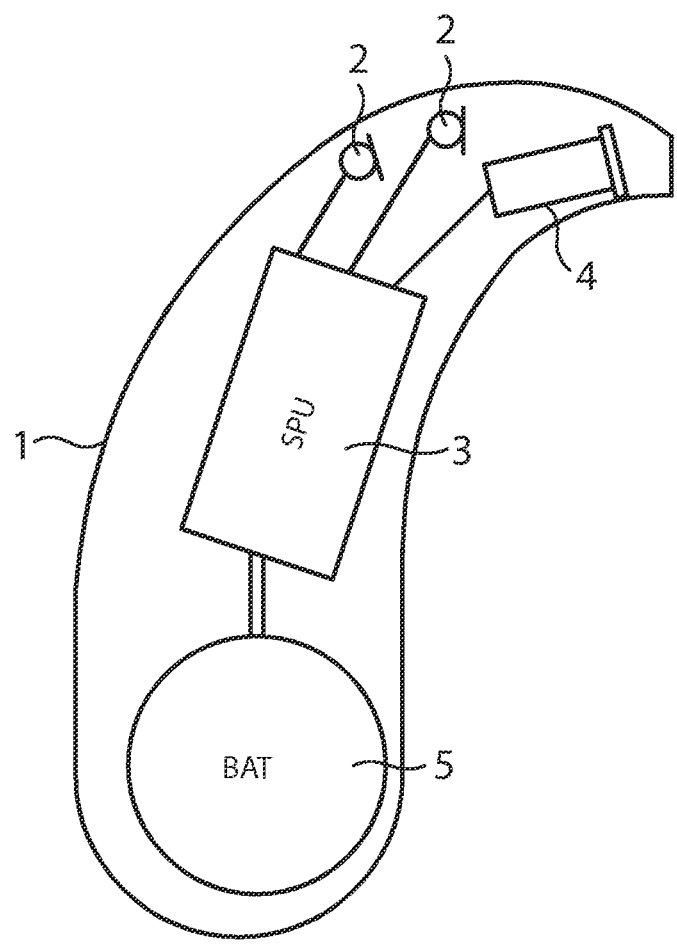
FIG. 1 shows a schematic structure of a hearing aid in accordance with the prior art.

Referring now to the figures of the drawing in detail, there are shown exemplary and preferred embodiments of the invention.

Figure 2:
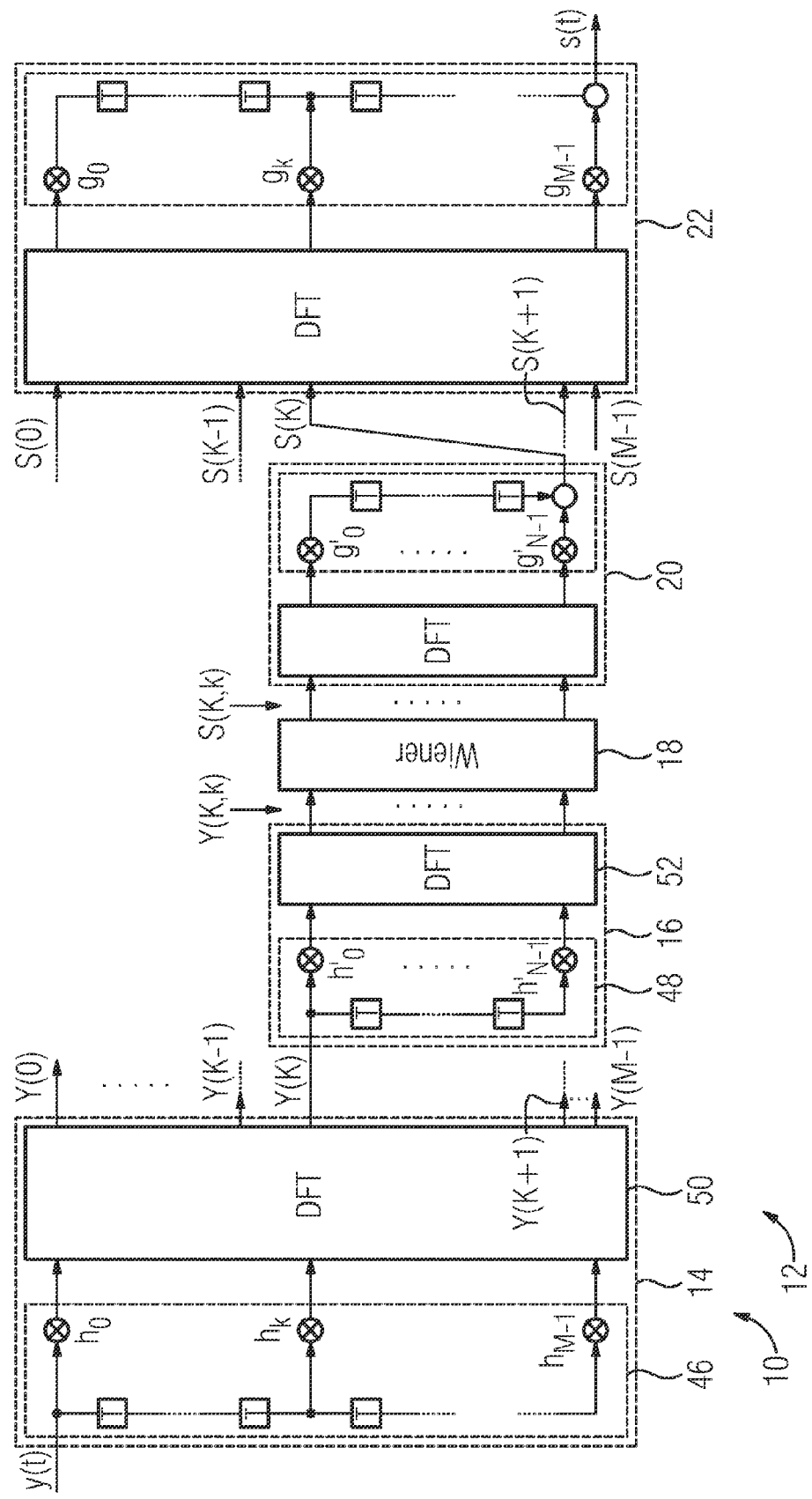
FIG. 2 shows a schematized block diagram of a signal processing unit of an embodiment of the hearing apparatus according to the invention.

FIG. 2 shows a signal processing unit 12 of a hearing apparatus 10. The hearing apparatus 10 in question can be an audio device such as a mobile telephone or a hearing aid. Generally speaking, the term hearing apparatus here is understood to be any device in which an at least two-stage filter bank can be used for a spectral signal analysis (analysis filter bank). In this situation, the signal processing unit 12 in question can for example be a digital signal processor (DSP), an ASIC (application specific integrated circuit), an FPGA (field programmable gate array) or a CPU (general purpose processing unit) of this device or also a combination of one or more thereof, In the example shown in FIG. 2 a digitized input signal y(t) is adaptively filtered, and the signal filtered in such a manner is output as an output signal s(t) in the form of a acoustic signal to a user of the hearing apparatus 10. The input signal y(t) in question is an audio signal (in other words a signal in the range between 0 Hz and 20 kHz) which is adaptively filtered by the signal processing unit 12. In the case of the output signal s(t), in comparison with the input signal y(t) a noise component is reduced while at the same time a desired signal component, such as a speech signal component or a music signal, is only insignificantly distorted. To this end, the input signal y(t) is split up by a transformation unit 14 onto a total of N channels in which the audio signal is represented by (complex-valued) sub-band signals Y(0), ..., Y(K−1), Y(K), Y(K+1), ... Y(M−1). For the sake of clarity, only some of the channels and the associated sub-band signals are illustrated in FIG. 2. The remaining channels are indicated by ellipses (...). The individual channels are referenced in the following by their index, in other words on the output side the transformation unit 14 has the channels 0 to (M−1)

The signal processing unit 12 can have a cascade consisting of a second stage transformation unit 16, a filter unit 18 and a second stage back-transformation unit 20 either in some of the channels or also in all the channels 0 to (M−1). For the sake of clarity, such a cascade is illustrated only for the channel K in FIG. 2.

The back-transformation unit 20 generates a first stage output signal S (K) which together with the remaining processed or also non-processed sub-band signals S(0) to S(M−1) of the remaining channels 0 to (M−1) is transferred to a first stage back-transformation unit 22. The back-transformation unit 22 generates the output signal s(t) from its input signals S(0) to S(M−1) by back-transformation.

Only those components relevant to the description of the invention are shown in FIG. 2. In particular, between the transformation units 14 and 16 or between the back-transformation units 20 and 22 may be situated further, signal-processing components which for instance can comprise an amplification unit for adjusting the signal level of the sub-band signal Y(K) or S(K) and of the remaining sub-band signals depending on an audiogram of a user of the hearing apparatus 10. Provision can likewise be made to shift the sub-band signals spectrally by means of a frequency compression process.

The transformation units 14 and 16 in question can for example be polyphase filter banks having respective segmenting units 46 and 48 and also a downstream discrete Fourier transformation (DFT) 50, 52.

In the following, the adaptive filtering of the sub-band signals is described by way of example with reference to the channel K. The actual adaptive filtering for the sub-band signal Y(K) of the channel K is performed by the filter unit 18. For the purpose of the adaptive filtering in the channel K, the sub-band signal Y(K) is however firstly transformed by the second stage transformation unit 16 into sub-sub-band signals Y(K,k) which form signals of sub-channels of the channel K. Through the transformation unit 16, the channel K can for example be split up into N=8 or N=16 sub-channels. Accordingly, there are then the sub-sub-band signals Y(K, 0) to Y(K, N−1).

Figure 3:
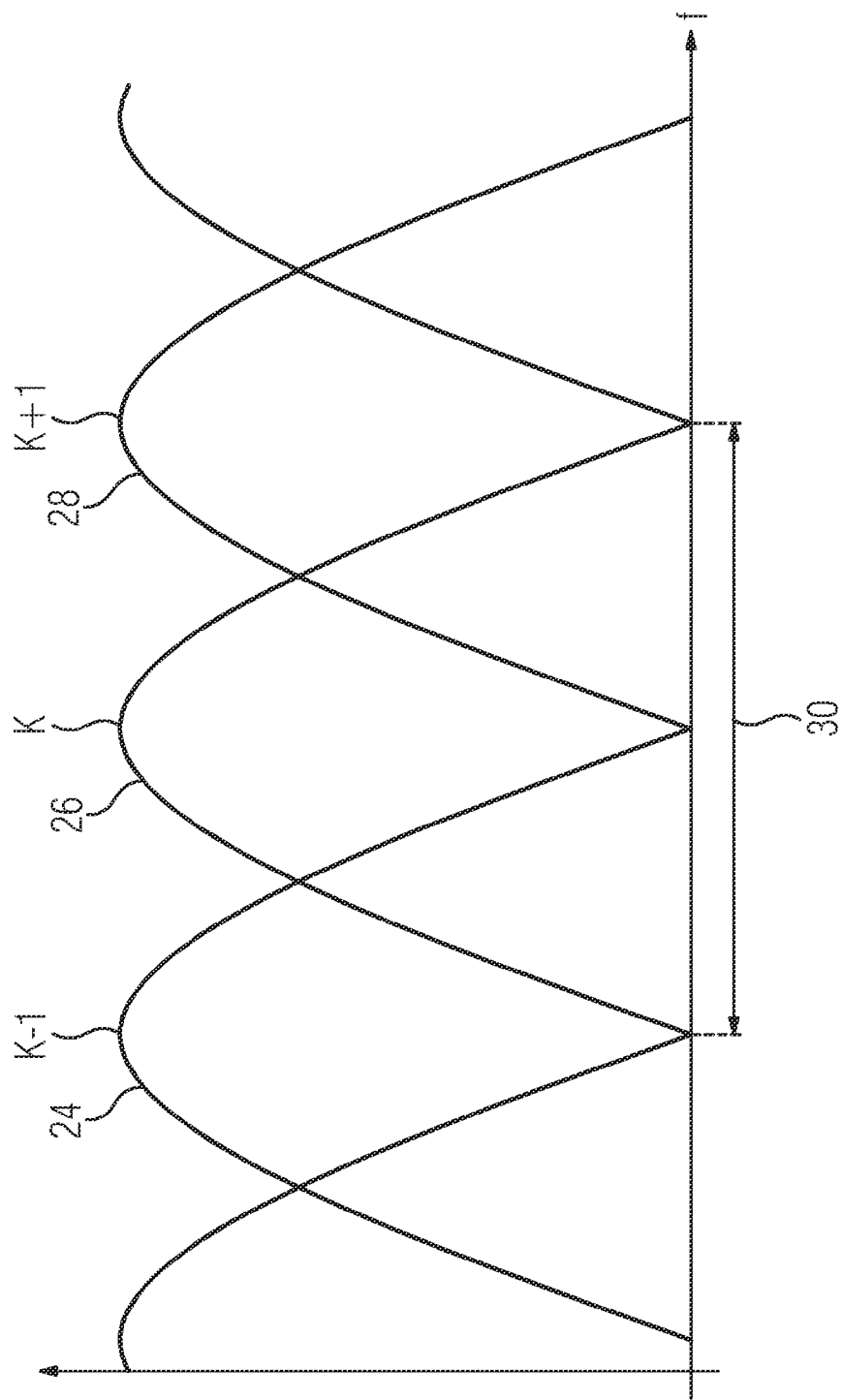
FIG. 3 shows a diagram with a schematized waveform of transfer functions of a first stage transformation unit of the hearing apparatus from FIG. 2.
Figure 4:
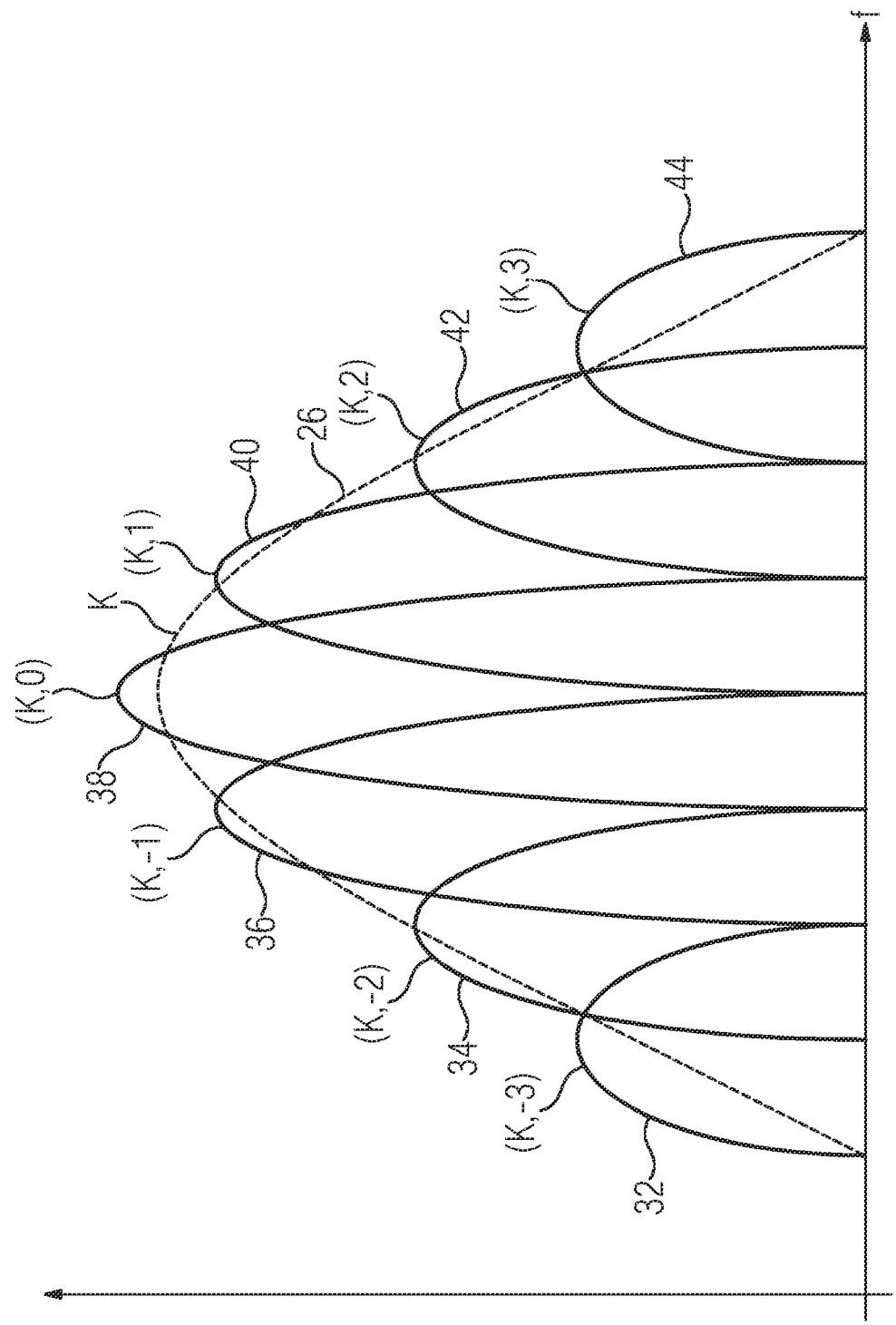
FIG. 4 shows a diagram with a schematized waveform of a transfer function of a second stage transformation unit of the hearing apparatus from FIG. 2.

The mode of operation of the first stage transformation unit 14 and the second stage transformation unit 16 is described once again in detail with reference to FIG. 3 and FIG. 4. In FIG. 3 and FIG. 4 (and also in the FIG. 6 described later), given as the abscissa in each case is the attenuation for the individual channels, as it results depending on the frequency f for the spectral components of the input signal y(t) in the individual channels. The transfer functions on the other side of the zero crossings which delimit the passbands are not illustrated here for the sake of clarity.

FIG. 3 shows schematized passbands 24, 26, 28 of transfer functions, as they result in the channels K−1, K and K+1 with respect to the input signal y(t). The so-called side lobes of the transfer functions are not illustrated in FIG. 3. The passbands 24, 26, 28 extend in each case between two null points of the transfer functions and can for example have a respective sub-bandwidth 30 of 250 Hz. As is shown in FIG. 3, the passbands 24, 26 of the adjacent channels K−1 and K overlap. The same applies to the adjacent channels K and K+1 (26 and 28).

FIG. 4 shows how the channel K can be split up by the second stage transformation unit 16 into for example eight sub-channels, of which only the passbands 32, 34, 36, 38, 40, 42, 44 from a total of 7 sub-channels are illustrated in FIG. 4, The indexing of the sub-channels differs from the indexing of the channels (0 to M−1) in that the index 0 is used for the (spectrally) center sub-channel, and on both sides of the center sub-channel with the passband 38 negative indices are used toward low frequencies and positive indices are used toward high frequencies. A sub-channel of a particular channel is referenced in the following in that on the one hand the index of the channel and on the other hand the index of the sub-channel is given, which means that in FIG. 4 the sub-channels (K, −3) to (K, 3) result. According to its passband 32 to 44, each of these sub-channels represents a component of the sub-band signal Y(K). In corresponding fashion, the sub-sub-band signals are also given in the manner described above similarly by giving the index of the channel and the subindex −3 to 3 of the sub-channel, in other words Y(K, −3) to Y(K, 3).

Figure 5:
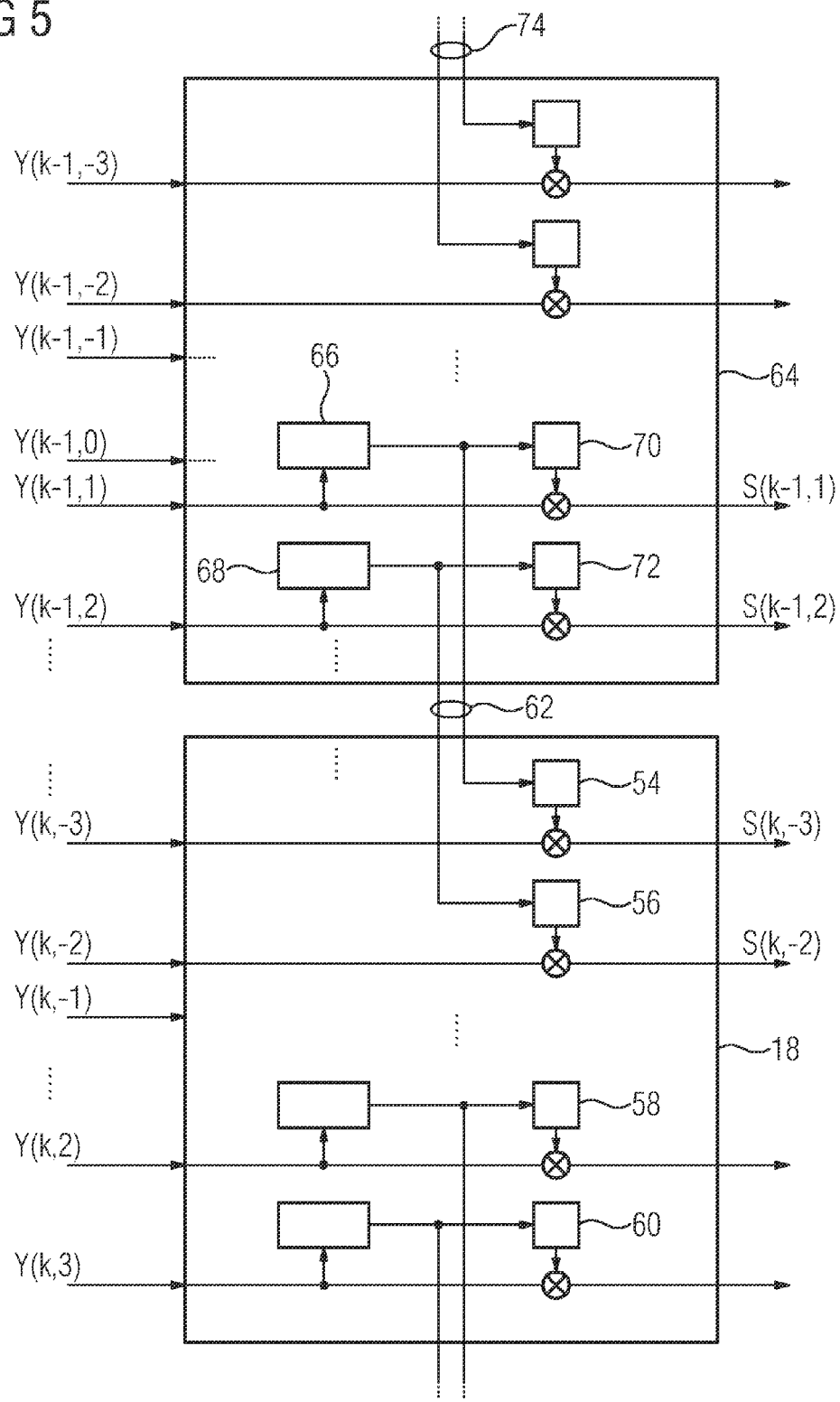
FIG. 5 shows a schematized block diagram of two filter units of the hearing apparatus from FIG. 2.

As is shown in FIG. 5 with reference to the sub-sub-band signals Y(K, −3) and Y(K, −2), the sub-sub-band signals of the channel K are in each case multiplied by a weighting factor 54, 56 which for example can have a value between 0 and 1. The respective sub-sub-band signal is attenuated here by a low value while a value dose to 1 ensures that the output signal S(K, −2) or S(K, −3) corresponds to the respective input signal Y(K, −2) or Y(K, −3). The weighting factors 54 and 56 in this situation have not been calculated by the filter unit 18 itself but have been received by way of a receive unit 62 from a filter unit 64 of the adjacent channel K−1. The filter unit 64 has an estimation unit 66, 68 in each of the sub-channels (K−1, 1) and (K−1, 2) and further sub-channels, The estimation units 66, 68 in question can for example be a Wiener filter or another statistical estimation unit. The estimation unit 66 of the sub-channel (K−1,1) calculates a weighting factor 70 for the sub-channel (K−1,1) depending on the sub-sub-band signal Y(K−1,1), by which the sub-sub-band signal Y(K−1,1) is multiplied in the described manner in order to obtain a filtered sub-sub-band signal S(K−1, 1). At the same time, the weighting factor 70 is taken over by way of the receive unit 62 of the filter unit 18 as the weighting factor 54. In the sub-channel (K−1, 2), depending on the sub-band signal Y(K−1, 2) a weighting factor 72 is calculated by the estimation unit 68 and is used as the weighting factor 56 both in the sub-channel (K−1,2) itself and also in the sub-channel (K, −2) of the filter unit 18. As is shown in FIG. 5 without the use of further reference characters, the filter unit 18 can also itself have estimation units for other sub-channels, here shown for (K,2) and (K,3). Likewise, the filter unit 64 can also have a receive unit 74 by way of which it can receive weighting factors from a filter unit.

Described by way of example in the following with reference to FIG. 6 to FIG. 10 is how in the case of the filter units 18 and 64 and the remaining filter units of the signal processing unit 12 the division between those sub-channels in which estimation units such as the estimation units 66 and 68 are provided and those sub-channels in which weighting factors are determined without a calculation by way of receive units such as the receive units 62 and 74 is expediently defined.

Figure 6:
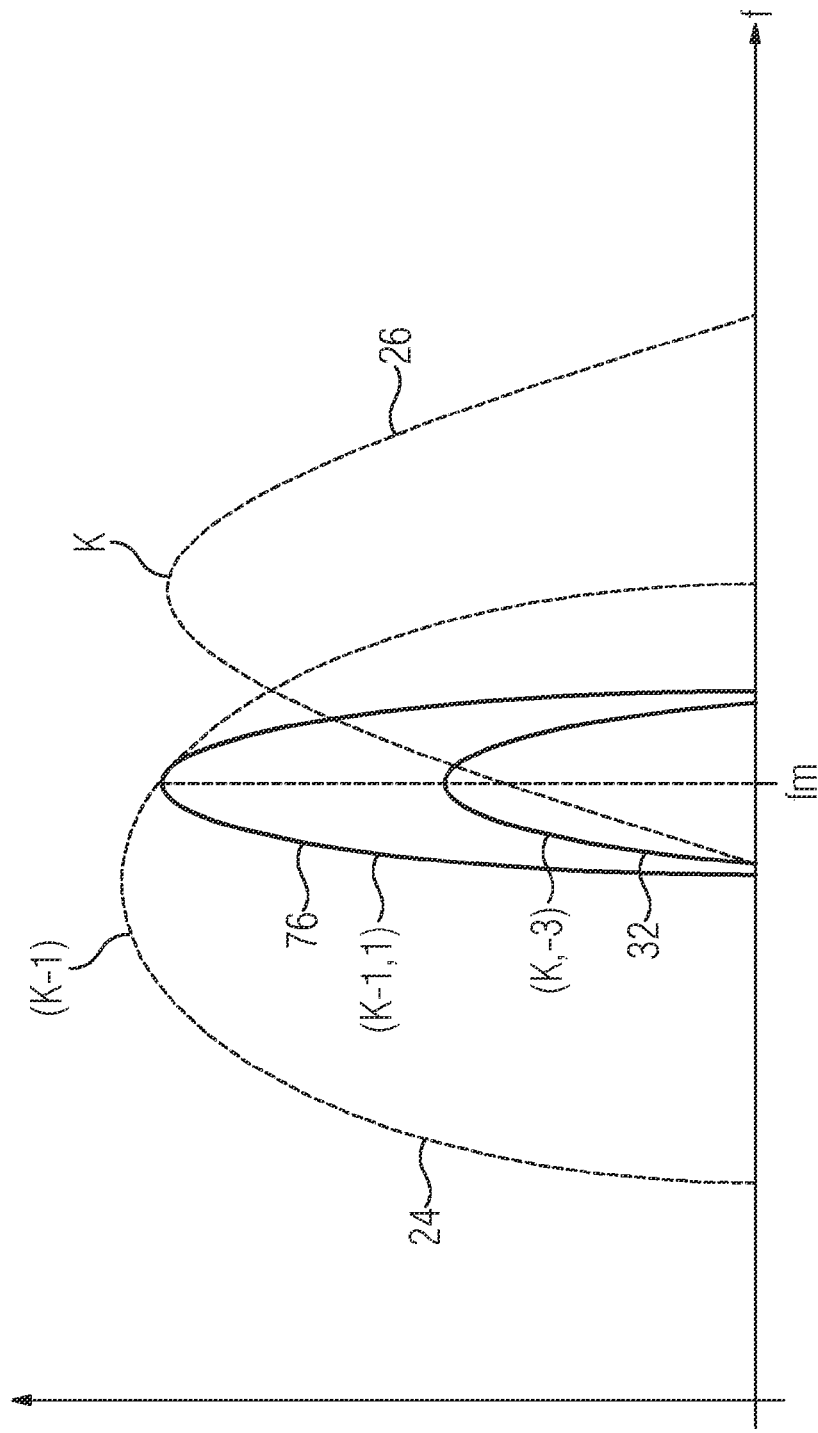
FIG. 6 shows a diagram of schematized transfer functions of two sub-channels having a common center frequency, as may be exhibited by the hearing apparatus from FIG. 2.

To this end, FIG. 6 shows once again the transfer regions 24 and 26 of the two spectrally adjacent channels K−1 and K. In the channel K−1 the sub-band signal Y(K−1) is split up by a further second stage transformation unit (not illustrated) into the sub-sub-band signals Y(K−1, −3) to Y(K−1, 3) illustrated in part in FIG. 5. For this purpose, the passband 76 for the sub-channel (K−1,1) is illustrated in FIG. 6, The spectral overlapping of the two adjacent channels K−1 and K (see FIG. 4) results in overlapping of the passbands 32 and 76 of the sub-channels (K−1,1) and (K,−3). In this situation the signal processing unit 12 is designed in such a manner that the passbands 32 and 76 have a common center frequency fm at which the transfer functions have a maximum in the two passbands 32, 76, The weighting factor 70 which is calculated by the estimation unit 66 acts on the sub-sub-band signal Y(K−1, 1) which is situated in the passband 76. FIG. 6 shows that the weighting factor 70 can also be used for the sub-sub-band signal Y(K,−3) in the passband 32. In corresponding fashion, the weighting factor 70 is transferred by the receive unit 62 into the filter unit 18 to the sub-channel (K,−3) as the weighting factor 54. The same also applies to the weighting factor 72.

Described in the following with reference to FIG. 7 to FIG. 10 for a further embodiment of the signal processing unit 12 is how (based on the above explanations) a weighting factor can be transferred not only onto one adjacent filter unit but at the same time onto a plurality of filter units adjacent to one another in pairs in each case. For this purpose, on the basis of FIG. 2, the following structure of the signal processing unit 12 is taken as the basis by way of example.

A modulated DFT filter bank is used as first stage transformation unit 14 and second stage transformation unit 16, where the input signal y(t) is received at a sampling frequency of 16 kHz. By means of the segmenting unit 46, the analysis filter bank of the first transformation unit 14 generates segments consisting of M=64 consecutive sampling values at a segment advance of R=16 sampling values. The individual sampling values of the segments are each weighted by means of multiplication using a Hann window function from values $h_0$ to $h_{m-1}$. The M=64 sampling values of a segment are transformed by the DFT 50 of the transformation unit 14 into individual sampling values of the sub-band signals Y(K) and output at a reduced sampling rate of 1 kHz. K here generally stands for the channel index K=0 to (M−1), such that Y(0) to Y(M−1) is therefore meant. The filter bank of the transformation unit 14 exhibits overall a frequency resolution of 250 Hz per channel. Each sub-band signal is split up into N=16 sub-sub-band signals Y(K,k) by the transformation unit 16 of the channel K and also by the remaining transformation units of the other channels, where k is used here in the following as a general index for the sub-sub-band signal, in other words k=−7 to +7. In order to generate the sub-sub-band signals, a segmenting unit 48 having a segment length N=16 and a Hann window $h'_0$ to $h'_{N-1}$ and a DFT 52 having the length N=16 are used as the analysis filter bank of the second stage transformation unit 16. From this results a frequency resolution of 62.5 Hz per sub-channel. The frequency resolution generally depends amongst other things on the sampling rate of the channels of the first stage. The sub-sub-band signals are then processed, for example by means of a noise reduction process, as is enabled by the filter unit 18 and the remaining filter units, in other words by applying spectral weighting factors in multiplicative fashion for example. A second stage synthesis filter bank, which in the case of the channel K generates a filtered sub-band signal S(K) from the filtered sub-sub-band signals S(K,k), is formed by the back-transformation unit 20. The synthesis filter bank of the back-transformation unit 20 is complementary to the synthesis filter bank of the transformation unit 16. A synthesis filter bank which is complementary to the analysis filter bank of the transformation unit 14 is likewise provided by the back-transformation unit 22. In this case, the synthesis filter banks each utilize rectangular windows from individual taps $g'_0$ to $g'_{N-1}$ or $g_0$ to $g_{M-1}$. It is also possible to use other window functions.

The sub-channels in the second processing stage of a plurality of channels overlap spectrally and center frequencies fm(K,k) for the passbands of the individual sub-channels result in accordance with the following equation:

$$fm(K,k)=|K*250\text{ Hz}+k*62.5\text{ Hz}.$$

Figure 7:
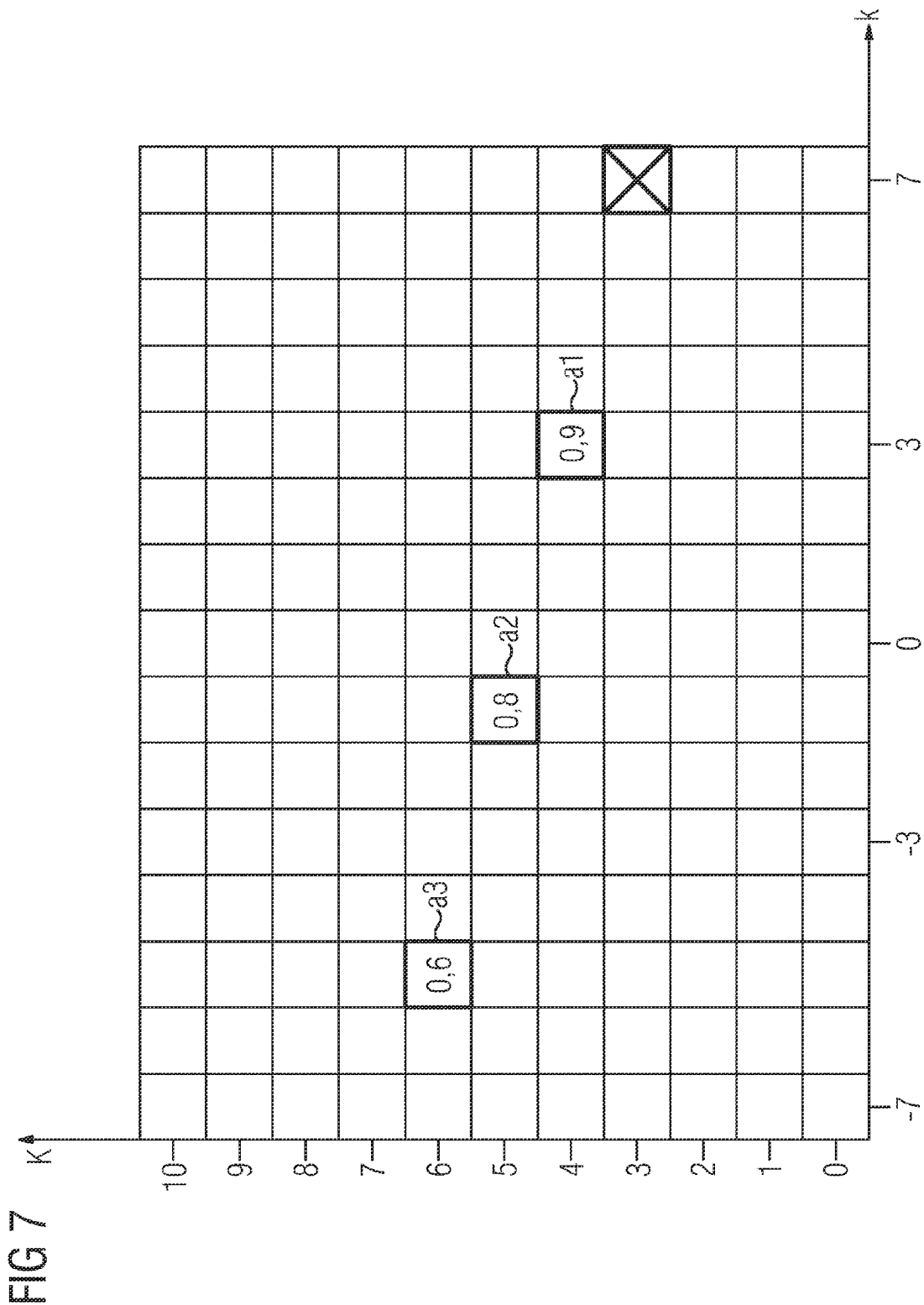
FIG. 7 shows a diagram of correlation values between sub-channels of the hearing apparatus from FIG. 2.

In order to define which weighting factors are to be calculated and which weighting factors are to be received by a receive unit, the cross-correlation a (K,k) of each channel (K,k) with all remaining sub-channels (K',k') where K'=0 . . . M−1 and k'=−7 . . . 7 is calculated in the following manner:

$$a(K,k)=E\{Y(K,k)^* Y(K',k')\}/\sqrt{[E\{|Y(K,k)|^2\}^* E\{|Y^*(K',k')|^2\}]},$$

where E{ } is the expected value operator and Y* is the conjugate complex value of Y. From this results a regular model which is shown in FIG. 7 by way of example for the correlation values a (3, 7) of the sub-channel (3, 7). The sub-bands (K',k')=(4, 3), (5, −1) and (6, −5) are correlated to a particularly high degree with the sub-channel (3, 7). Possible correlation values a1, a2, a3 are entered in FIG. 7 by way of example. Significantly lower correlation values are present in the empty fields here (for instance 0.2 and less). The sub-channels in question correlated to a high degree with the sub-channel (3, 7) are those whose passband has the same center frequency as the sub-channel (3, 7) (see the above equation for fm(K,k)).

More generally, it follows that in the case of the filter structure described here a sub-channel (K,k) and a sub-channel (K+1, k−4) are correlated to a particularly high degree. Only the sub-channel for the channel K=0 having the lowest center frequency forms an exception to this regular model. The signal of this "lowest" channel K=0 is as a general rule real-valued, from which in the sub-channels of the channel K=0 signals result which are mirror-symmetric with respect to the sub-channel (0,0), in other words the sub-channels (0,−1) and (0,1) have signals having the same value, likewise the sub-channels (0,−2) and (0,2) etc.

On account of the high correlation values of sub-channels having passbands overlapping one another, very similar weighting factors result in each case for all these sub-channels when a calculation of weighting factors is performed by corresponding estimation units. In order to reduce the calculation overhead, only one weighting factor is therefore calculated in one of these sub-channels and the weighting factor calculated in this manner is copied into the remaining sub-channels. In an extreme case only a single weighting factor needs to be calculated per possible center frequency fm(K,k).

Figure 8:
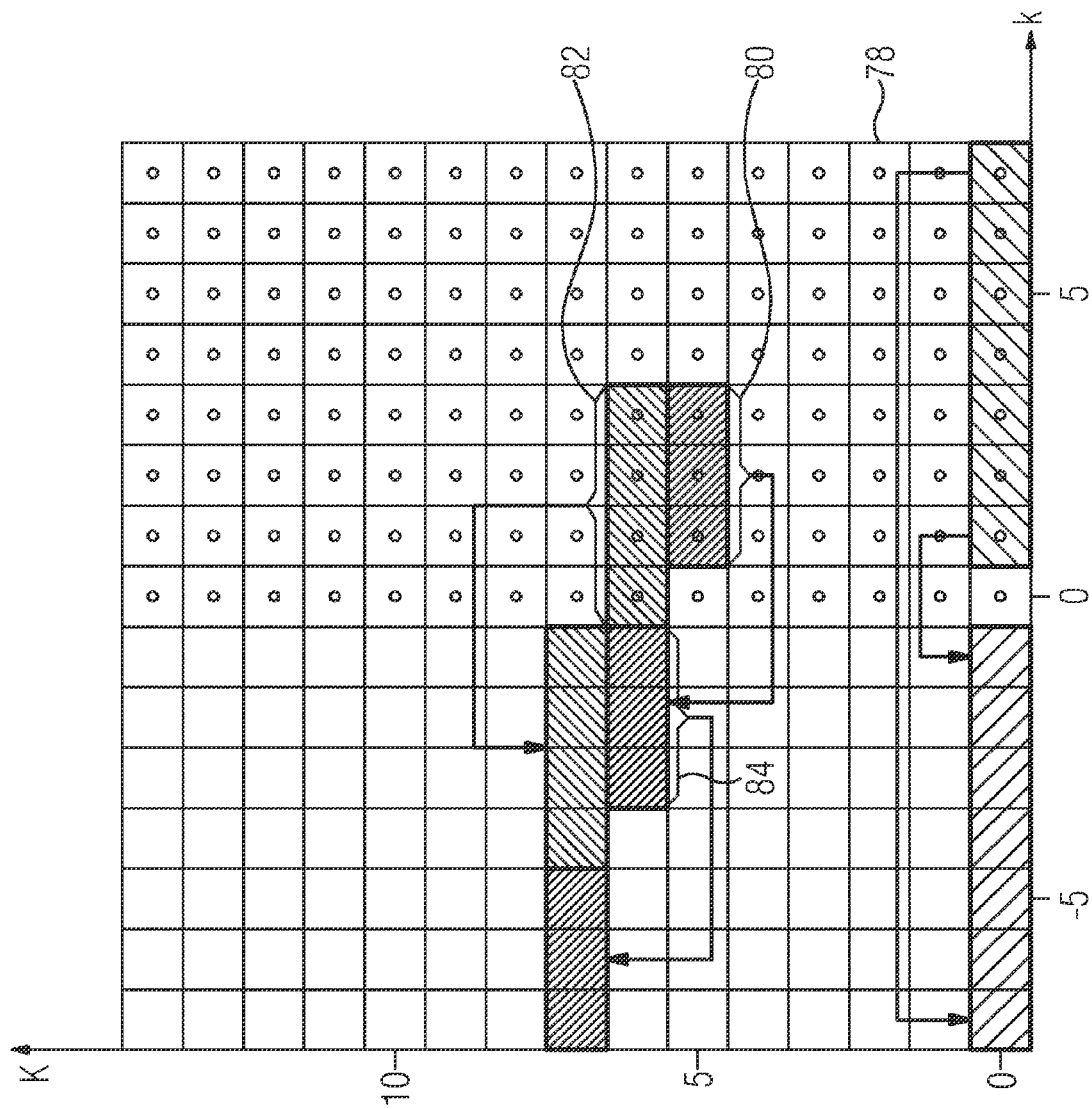
FIG. 8 shows a diagram of a copy model for weighting factors.
Figure 9:
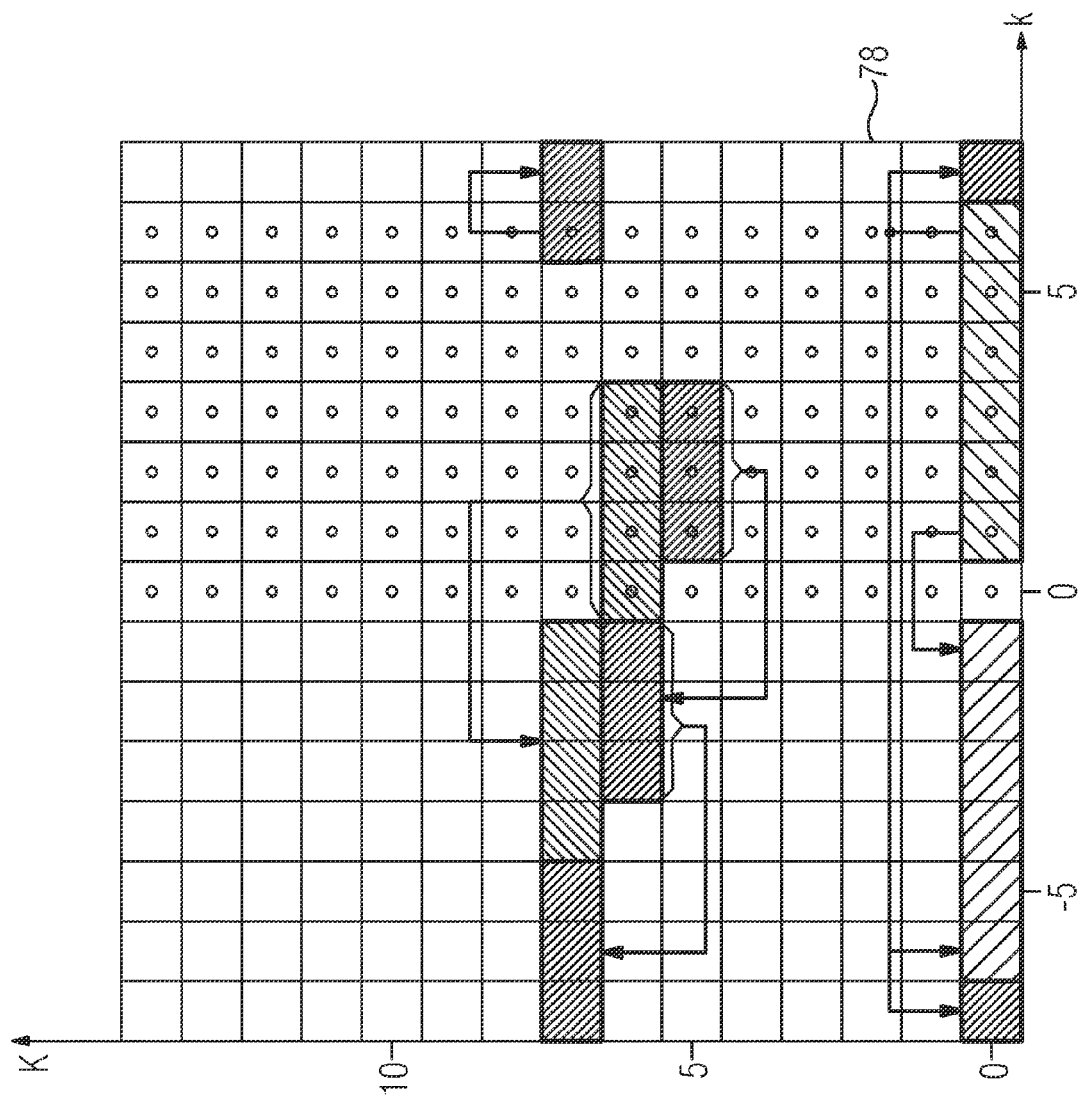
FIG. 9 shows a diagram of a further copy model for weighting factors.
Figure 10:
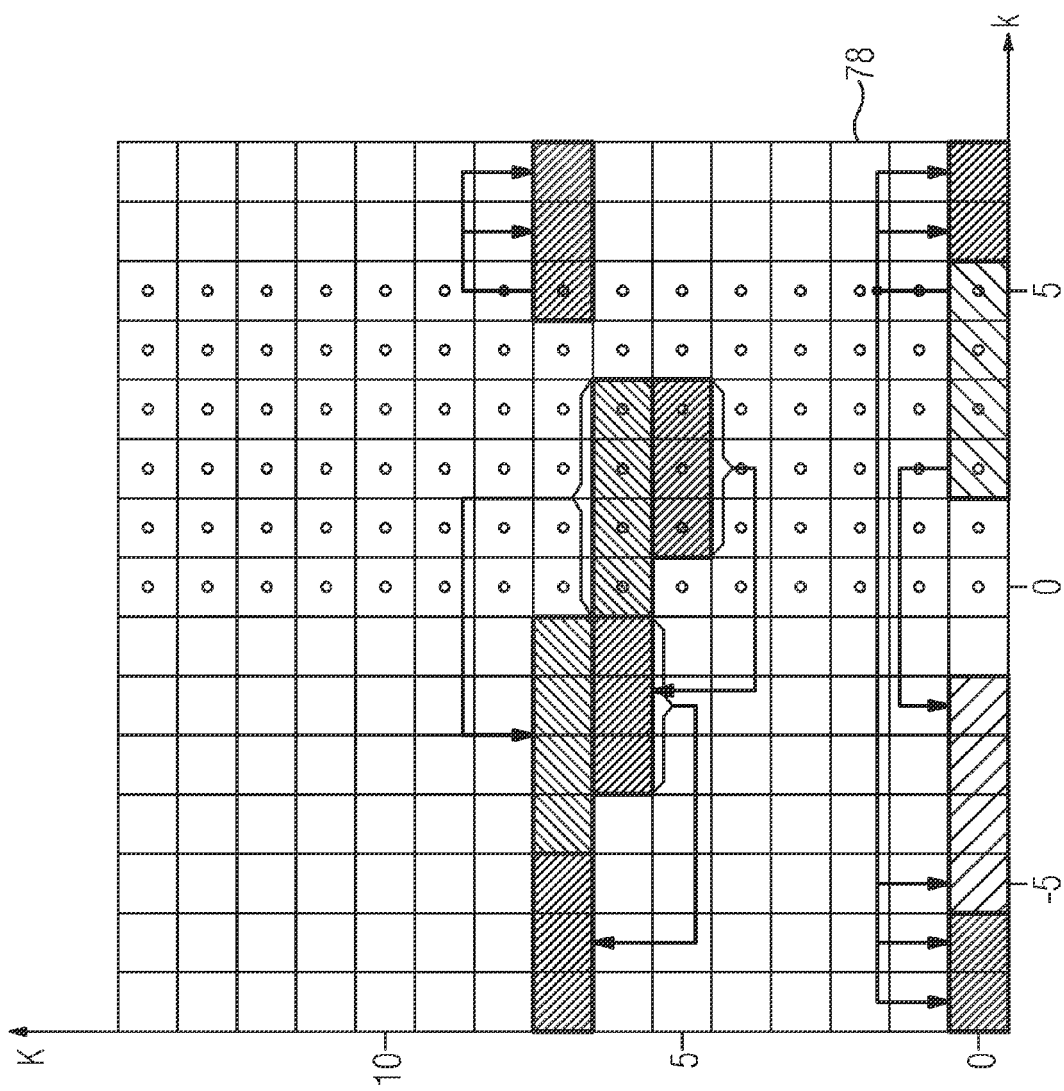
FIG. 10 shows a diagram of a third copy model for weighting factors.

In order to enable such efficient operation of the signal processing unit 12 provision can be made to store all the weighting factors in a common memory 78, as is shown by way of example in FIG. 8, FIG. 9 and FIG. 10. The individual memory cells are shown in FIG. 8 to FIG. 10, where the memory cells for the individual weighting factors are identified by indices for the channels K and their sub-channels k. Overall, each memory cell can be filled with a weighting factor. The sixteenth band, not illustrated FIG. 8 to FIG. 10, is always set to zero because it contains an only insignificant component of the input signal y(t).

In order to transfer calculated weighting factors onto other sub-channels efficient copy models can now be used which utilize the above regularity of correlation. This means that groups 80, 82, 84 each consisting of a plurality of weighting factors in a certain channel K can always be copied from channels K−1. K−2 etc. with a lower center frequency if they have already been calculated there once before.

To this end, FIG. 8 demonstrates a possible copy model with reference to individual copy operations. In FIG. 8, some of the memory cells each contain a point. These memory cells contain weighting factors which have actually been calculated by an estimation unit depending on the signals of the associated sub-channels (the same illustration has also been used for FIG. 9 and FIG. 10). According to FIG. 8, weighting factors are therefore always calculated for the sub-channels k=0 to 7. The memory cells which are illustrated without a point do not initially have any calculated weighting factors. In the channel K=0, the weighting factors are copied mirror-symmetrically into the sub-channels k=1 to −7 of the channel K=0. For the remaining channels K, the missing weighting factors are defined in accordance with a copy mod& which is demonstrated by way of example of the channel K=7, The weighting factors of the adjacent, lower-frequency channel K=6 and here of the sub-channels k=0 to 3 are copied into the channel 7 into the sub-channels k=−4 to −1. The remaining weighting factors of the remaining sub-channels k=−7 to −5 are transferred from the channel K=5 and here from the latter's sub-channels k=1 to 3 by means of a twofold copy operation as indicated in FIG. 8. FIG. 8 shows that only half of all the weighting factors therefore actually need to be calculated by the relatively computationally intensive estimation process. With reference to the copy model according to FIG. 8, a hearing test additionally yields the result that the filtered output signal s(t) cannot be significantly differentiated by test listeners from a signal which has been filtered with weighting factors which have been calculated separately for each sub-channel. A potentially audible difference results from the fact that although the passbands of the individual sub-channels may have a common center frequency fm (see FIG. 6) the maxima of the passbands are however different. For this reason it has hitherto also not been possible in an obvious manner to recognize that the use of weighting factors yields such a good result with regard to the audio quality for a plurality of sub-channels. In the hearing test, the result of which is illustrated in FIG. 11, a total of 20 persons were requested to subjectively assess the quality of a noisy speech signal which was filtered using different configurations. The result is divided into a) the Speech Quality (SQ), b) the Residual Noise Quality (RNQ) and c) the Overall Impression (OV). The speech examples were filtered using a filter bank having low frequency resolution (only a first stage transformation stage-LOW) on the one hand and on the other hand using a two-stage filter bank once using a second stage transformation unit with N=16 (Lh2=16) and once using a second stage transformation unit with N=8 sub-channels (Lh2=8). The result for a two-stage filter bank, as is shown in FIG. 2 and with N=8 sub-channels in the second stage and additionally the use of a copy model in accordance with FIG. 8 is shown as RC (Reduced Complexity). In this situation the audio samples comprise speech signals at a signal-to-noise ratio both of 0 dB and of −5 dB. The test persons were required to grade the signal in a range from 0 (audio quality poor) to 6 (audio quality good). The boxes shown in FIG. 11 mark the 25th percentile (P25) with their lower horizontal edge, the median (P50) with their center horizontal line and the 75th percentile (P75) with their upper horizontal edge, such that the height of the boxes yields the interquartile range (IQR). The freestanding horizontal dashes indicate the value P75+1.5*IQR above the respective boxes and the value P25−1.5*IQR beneath the boxes in each case. The crosses represent outliers in the assessment.

FIG. 9 and FIG. 10 demonstrate further copy models. By means of these it is possible to yet further reduce the number of calculations required. To this end, within a filter unit, the weighting factor of the sub-channel k=6 is also copied into the sub-channel k=7 (FIG. 9) or the weighting factor of the sub-channel k=5 is copied into the two sub-channels k=6 and 7 (FIG. 10).

To summarize, it can be stated that the calculation overhead for speech signal enhancement in the case of a two-stage filter bank arrangement can be reduced by 50 percent and more by means of the described copy models without the speech quality in the filtered output signal being considered as noticeably impaired by the test persons as a result. The copy models constitute a simple and easily realized possible way of implementing the knowledge described here. In this connection they utilize all the significant dependencies between the sub-channels which can be determined by the cross-correlations between the channels. From the result of the hearing test shown in FIG. 11 it can be clearly seen that no significant impairment of the audio quality results from the reduction in calculation overhead.

The invention claimed is:

1. A method for the adaptive filtering of an audio signal, the method which comprises:
   transforming the audio signal by a first transformation stage and thereby generating a sub-band signal in each of a plurality of channels; and
   in at least some of the plurality of channels, adaptively filtering the respective sub-band signal by a filter unit of the channel, and thereby in the channel:
      transforming the sub-band signal by a second transformation stage and splitting into a plurality of sub-channels of the channel; and
      in each sub-channel, defining a weighting factor for the signal of the sub-channel by the filter unit of the channel;
   wherein, with regard to at least one of the filter units, the weighting factor of at least one sub-channel is defined by calculation depending on the signal of the sub-channel itself and the calculated weighting factor is transferred by the filter unit to at least one other filter unit, and with regard to the at least one other filter unit, the weighting factor of at least one sub-channel is defined on the basis of the received, calculated weighting factor.

2. The method according to claim 1, which comprises transferring the calculated weighting factor of a first sub-channel to a sub-channel that overlaps spectrally with the first sub-channel and which, in particular, shares a common center frequency with the first sub-channel.

3. The method according to claim 1, which comprises transferring the calculated weighting factor of a first sub-channel to a sub-channel where a value for a cross-correlation between its own signal and the signal of the first sub-channel is greater than a predetermined threshold value.

4. The method according to claim 1, which comprises setting at least one weighting factor to the same value as the received, calculated weighting factor.

5. The method according to claim 1, which comprises transferring a plurality of calculated weighting factors of adjacent sub-channels of a first channel in accordance with a predetermined copy model into a memory of a filter unit of a second channel, where the plurality of the calculated weighting factors form the weighting factors of adjacent sub-channels of the second channel.

6. The method according to claim 1, which comprises transferring at least one weighting factor of a first filter unit in total to at least two further filter units.

7. The method according to claim 1, which comprises, within at least one of the filter units, transferring a weighting factor to another sub-channel of the at least one filter unit.

8. The method according to claim 1, wherein the filter units belong to adjacent channels and all the weighting factors to be transferred are transferred only frequency upward to a filter unit of a channel having a higher center frequency or only frequency downward to a filter unit of a channel having a lower center frequency.

9. The method according to claim 1, wherein a plurality of adjacent channels each have a filter unit and for each of the filter units:
 a) the weighting factors in some of the sub-channels are defined by calculation or by predefining a predetermined value; and
 b) the weighting factors of other sub-channels are received from at least one other filter unit.

10. The method according to claim 1, wherein the adaptive filtering of the sub-band signal by the filter unit of at least one channel comprises:
 a) weighting the signal of each sub-channel in accordance with the defined weighting factor; and
 b) jointly back-transforming the weighted signals of all sub-channels of the channel by way of a back-transformation stage and combining the signals to form a filtered sub-band signal.

11. The method according to claim 1, wherein the adaptive filtering of the sub-band signal by the filter unit of at least one channel comprises:
 a) jointly back-transforming the weighting factors of all sub-channels by way of a back-transformation stage and combining to form a filter function; and
 b) generating a filtered sub-band signal by filtering the sub-band signal by way of the filter function.

12. A hearing apparatus, comprising:
 a first stage transformation unit disposed to receive a signal and configured to split the signal through transformation onto a plurality of channels;
 at least two second stage transformation units each splitting the signal of one of the plurality of channels through transformation into sub-channels of the one channel;
 a filter unit in each of the plurality of channels having a second stage transformation unit,
  said filter unit being configured to filter the signal of the respective channel depending on weighting factors determined for the sub-channels; and
  said filter unit having an estimation unit in some of the sub-channels, said estimation unit being configured to calculate the weighting factor of the sub-channel depending on the signal of the sub-channel; and
  said filter unit having a receive unit in each case in some other of the sub-channels, said receive unit being configured to receive a calculated weighting factor from another filter unit and to define the calculated weighting factor received from the other filter unit as the weighting factor of the sub-channel.

13. The hearing apparatus according to claim 12, wherein adjacent channels overlap spectrally.

14. The hearing apparatus according to claim 13, wherein a sub-channel of a first channel and a sub-channel of a second channel share a common center frequency.

15. The hearing apparatus according to claim 12, wherein each of said estimation units includes a statistical estimator for a useful signal component of the signal of the respective sub-channel and the weighting factors in each case constitute a filter gain.

16. The hearing apparatus according to claim 15, wherein said statistical estimator is a Wiener filter.

17. The hearing apparatus according to claim 12, wherein at least one of said transformation units is configured for a spectral transformation and/or is a filter bank.

18. The hearing apparatus according to claim 17, wherein the spectral transformation is a discrete Fourier transformation and the filter bank is a polyphase filter bank.

19. The hearing apparatus according to claim 12, which further comprises a back-transformation unit configured to back-transform output signals from said filter units to thereby generate a filtered audio signal.

* * * * *